(12) United States Patent
Zhang (10) Patent No.: US 11,810,637 B2
(45) Date of Patent: *Nov. 7, 2023

(54) DATA TRANSMISSION CIRCUIT, DATA TRANSMISSION METHOD, AND STORAGE APPARATUS WITH READ-WRITE CONVERSION CIRCUIT

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/715,943

(22) Filed: Apr. 7, 2022

(65) Prior Publication Data

US 2022/0328079 A1    Oct. 13, 2022

Related U.S. Application Data

(63) Continuation of application No. PCT/CN2021/120528, filed on Sep. 26, 2021.

(30) Foreign Application Priority Data

Apr. 13, 2021    (CN) ......................... 202110397025.X (51) Int. Cl.
    *G11C 7/10*       (2006.01)
    *G11C 29/42*      (2006.01)
    *H03K 19/20*      (2006.01)

(52) U.S. Cl.
    CPC .......... *G11C 7/1045* (2013.01); *G11C 7/1057* (2013.01); *G11C 7/1084* (2013.01); *G11C 29/42* (2013.01); *H03K 19/20* (2013.01)

(58) Field of Classification Search
    CPC ... G11C 7/1045; G11C 7/1057; G11C 7/1084; G11C 7/1006; G11C 29/42; G11C 29/52; H03K 19/20
    See application file for complete search history.

(56) References Cited

U.S. PATENT DOCUMENTS

| 11,113,218 B1 | 9/2021 | Yamanaka et al. |
| 2009/0276688 A1 | 11/2009 | Yoshida |

(Continued)

FOREIGN PATENT DOCUMENTS

| CN | 1551242 A | 12/2004 |
| CN | 101667451 A | 3/2010 |

(Continued)

OTHER PUBLICATIONS

United States Patent and Trademark Office, Non-Final office action issued in related application No. 17/17,159 dated Sep. 14, 2023, 23 pages.

*Primary Examiner* — Sultana Begum
(74) *Attorney, Agent, or Firm* — KILPATRICK TOWNSEND & STOCKTON LLP (57) ABSTRACT

Embodiment relates to a data transmission circuit. In the circuit, an encoding circuit is configured to generate check code data according to first data on a first data line; a comparison circuit is configured to compare the first data with second data on a second data line to output a comparison result indicating whether number of different bits between the first data and the second data exceeds a preset threshold; a buffer circuit is configured to transmit the first data or opposite data of the first data to the second data line according to the comparison result; the buffer circuit is also configured to transmit the check code data to the second data line; a first read-write conversion subcircuit is configured to transmit the first data or the opposite data of the first data (Continued)

transmitted to the second data line to a third data line according to the comparison result.

15 Claims, 7 Drawing Sheets

(56) References Cited

U.S. PATENT DOCUMENTS

| | | |
|---|---|---|
| 2011/0035644 A1 | 2/2011 | Madan |
| 2011/0280296 A1 | 11/2011 | Wang et al. |
| 2016/0225417 A1 | 8/2016 | Lim |
| 2020/0341869 A1 | 10/2020 | Langadi et al. |
| 2022/0310139 A1* | 9/2022 | Zhang ................. G06F 3/06 |

FOREIGN PATENT DOCUMENTS

| | | |
|---|---|---|
| CN | 103780506 A | 5/2014 |
| CN | 105634504 A | 6/2016 |
| CN | 107222298 A | 9/2017 |
| CN | 109036240 A | 12/2018 |
| CN | 210667806 U | 6/2020 |
| CN | 211404066 U | 9/2020 |
| CN | 111951855 A | 11/2020 |
| CN | 112309484 A | 2/2021 |
| WO | 2019127350 A1 | 7/2019 |

* cited by examiner

DATA TRANSMISSION CIRCUIT, DATA TRANSMISSION METHOD, AND STORAGE APPARATUS WITH READ-WRITE CONVERSION CIRCUIT

CROSS-REFERENCE TO RELATED APPLICATION

This application is a continuation of PCT/CN2021/120528, filed on Sep. 26, 2021, which claims priority to Chinese Patent Application No. 202110397025.X titled "DATA TRANSMISSION CIRCUIT, DATA TRANSMISSION METHOD, AND STORAGE APPARATUS" and filed on Apr. 13, 2021, the entire contents of which are incorporated herein by reference.

BACKGROUND

With the rapid development of semiconductor technologies, density and number of memory cells in memory cell arrays of semiconductor storage apparatuses have been increasing to meet market demands for storage capacity of the semiconductor storage apparatuses, leading to increase in width and length of data transmission paths through which data are written into storage array regions, such that power consumption of the data transmission paths of written data between data pads and the storage array regions significantly increase. Furthermore, the increase of the data transmission paths will increase probability of occurrence of exceptions during data transmission, which reduces accuracy of data transmission.

How to reduce the power consumption during the data transmission of the data written into the storage array regions and to improve the accuracy of writing the data into the storage array regions while ensuring that the density and the number of memory cells in the semiconductor memory cell arrays are not reduced has become one of technical problems to be solved urgently in the process of further improving energy-saving performance and storage performance of the semiconductor storage apparatuses.

SUMMARY

The present disclosure relates to the field of semiconductor storage technologies, and more particularly, to a data transmission circuit, a data transmission method, and a storage apparatus.

A first aspect of the present disclosure provides a data transmission circuit, which includes an encoding circuit, a comparison circuit, a buffer circuit, a first read-write conversion subcircuit, and a second read-write conversion subcircuit. The encoding circuit is configured to generate check code data according to first data on a first data line. The comparison circuit is configured to receive the first data on the first data line and second data on a second data line, and compare the first data with the second data to output a comparison result indicating whether number of different bits between the first data and the second data exceeds a preset threshold, wherein the first data and the second data have a same preset bit width. The buffer circuit is electrically connected to the first data line, the comparison circuit, the encoding circuit, and the second data line. The buffer circuit is configured to transmit opposite data of the first data to the second data line when the comparison result is indicative of exceeding the preset threshold, and transmit the first data to the second data line when the comparison result is indicative of not exceeding the preset threshold. Furthermore, the buffer circuit is also configured to transmit the check code data to the second data line. The first read-write conversion subcircuit is electrically connected to both the second data line and the third data line, and the first read-write conversion subcircuit is configured to invert the opposite data of the first data transmitted to the second data line and then transmit the inverted opposite data to the third data line when the comparison result is indicative of exceeding the preset threshold, and transmit the first data transmitted to the second data line to the third data line when the comparison result is indicative of not exceeding the preset threshold. The second read-write conversion subcircuit is electrically connected to both the second data line and the third data line, and the second read-write conversion subcircuit is configured to transmit the check code data on the second data line to the third data line. A transmission path between the buffer circuit and the first read-write conversion subcircuit has a first length, and a transmission path between the buffer circuit and the second read-write conversion subcircuit has a second length, wherein the first length is not less than the second length.

A second aspect of the present disclosure provides a storage apparatus, which includes the above-mentioned data transmission circuit and is configured to store and transmit data of a read operation or write operation.

A third aspect of the present disclosure provides a data transmission method, which includes: generating check code data according to first data on a first data line; comparing the first data on the first data line with second data on a second data line, to output a comparison result indicating whether number of different bits between the first data and the second data exceeds a preset threshold, wherein the first data and the second data have a same preset bit width; controlling a buffer circuit to transmit opposite data of the first data to the second data line when the comparison result is indicative of exceeding the preset threshold, and transmit the first data to the second data line when the comparison result is indicative of not exceeding the preset threshold; wherein the buffer circuit is also configured to transmit the check code data to the second data line; controlling a first read-write conversion subcircuit to invert the opposite data of the first data transmitted to the second data line and then transmit the inverted opposite data to the third data line when the comparison result is indicative of exceeding the preset threshold, and transmit the first data transmitted to the second data line to the third data line when the comparison result is indicative of not exceeding the preset threshold; and controlling a second read-write conversion subcircuit to transmit the check code data on the second data line to the third data line. A transmission path between the buffer circuit and the first read-write conversion subcircuit has a first length, and a transmission path between the buffer circuit and the second read-write conversion subcircuit has a second length, wherein the first length is not less than the second length.

Details of each embodiment of the present disclosure will be described in the following drawings and descriptions. Based on the specification, drawings and claims, those skilled in the art will easily understand other features, problems to be solved, and technical effects of the present disclosure.

BRIEF DESCRIPTION OF THE DRAWINGS

To more clearly describe technical solutions in embodiments of the present disclosure, accompanying drawings required for describing the embodiments will be briefly introduced below. Additional details or examples used to describe the accompanying drawings should not be considered as limitations on scope of any one of invention and creation of the present disclosure, the currently described embodiments or implementations.

FIG. 4b is a schematic diagram of an implementation of FIG. 4a;

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. In addition, certain terms used throughout the specification and the following claims refer to particular components. Those skilled in the art will understand that manufacturers may represent components with different names. This document does not intend to distinguish between components with different names but the same functions. In the following description and embodiments, the terms "including" and "comprising" are used in an open-ended fashion, and thus should be interpreted as "including, but not limited to . . . ".

Likewise, the term "connection" is intended to express an indirect or direct electrical connection. Correspondingly, if one device is connected to another device, the connection between the two devices may be achieved by means of a direct electrical connection, or by means of an indirect electrical connection of other devices and connectors.

It should be understood that although terms such as "first", "second" and the like may be used herein to describe various components, these components should not be limited by these terms. These terms are only intended to distinguish one component from another one. For example, a first component may be termed a second component, and similarly, a second component may be termed a first component, without departing from the scope of the present disclosure.

Figure 1:
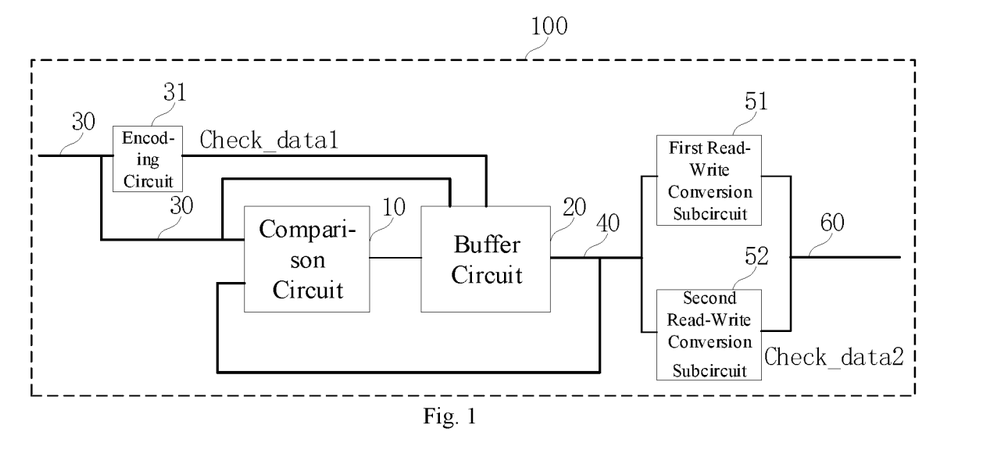
FIG. 1 is a schematic diagram showing a circuit principle of a data transmission circuit according to a first embodiment of the present disclosure.

Referring to FIG. 1, in one embodiment of the present disclosure, there is provided a data transmission circuit 100, which includes a comparison circuit 10, a buffer circuit 20, an encoding circuit 31, a first read-write conversion subcircuit 51, and a second read-write conversion subcircuit 52. The encoding circuit 31 is configured to generate check code data Check_data1 according to first data on a first data line 30. The comparison circuit 10 is configured to receive the first data on the first data line 30 and second data on a second data line 40, and compare the first data with the second data to output a comparison result indicating whether number of different bits between the first data and the second data exceeds a preset threshold, wherein the first data and the second data have a same preset bit width. The buffer circuit 20 is electrically connected to the first data line 30, the comparison circuit 10, the encoding circuit 31, and the second data line 40. The buffer circuit 20 is configured to transmit opposite data of the first data to the second data line 40 when the comparison result is indicative of exceeding the preset threshold, and transmit the first data to the second data line 40 when the comparison result is indicative of not exceeding the preset threshold. The buffer circuit 20 is also configured to transmit the check code data Check_data1 to the second data line 40. The first read-write conversion subcircuit 51 is electrically connected to both the second data line 40 and a third data line 60. The first read-write conversion subcircuit 51 is configured to invert the opposite data of the first data transmitted to the second data line 40 and then transmit the inverted opposite data to the third data line 60 when the comparison result is indicative of exceeding the preset threshold, and transmit the first data transmitted to the second data line 40 to the third data line 60 when the comparison result is indicative of not exceeding the preset threshold. The second read-write conversion subcircuit 52 is electrically connected to both the second data line 40 and the third data line 60. The second read-write conversion subcircuit 52 is configured to transmit the check code data Check_data2 on the second data line 40 to the third data line 60. A transmission path between the buffer circuit 20 and the first read-write conversion subcircuit 51 has a first length L1, and a transmission path between the buffer circuit 20 and the second read-write conversion subcircuit 52 has a second length L2, wherein L1≥L2.

As an example, with continued reference to FIG. 1, the check code data Check_data1 are generated by means of the encoding circuit 31 according to the first data on the first data line 30, such that subsequently an error detection and/or an error correction are performed on data in a storage array region according to the check code data Check_data1, to improve accuracy of stored data. The first data on the first data line 30 are compared with the second data on the second data line 40 by means of the comparison circuit 10, to output a comparison result indicating whether number of different bits between the first data and the second data exceeds a preset threshold, wherein the first data and the second data have the same preset bit width. Next, the opposite data of the first data are transmitted to the second data line 40 by means of the buffer circuit 20 when the comparison result is indicative of exceeding the preset threshold, and the first data are transmitted to the second data line 40 by means of the buffer circuit 20 when the comparison result is indicative of not exceeding the preset threshold. The buffer circuit 20 is also configured to transmit the check code data Check_data1 to the second data line 40. Accordingly, the first read-write conversion subcircuit 51 can invert the opposite data of the first data transmitted to the second data line 40 and then transmit the inverted opposite data to the third data line 60 when the comparison result is indicative of exceeding the preset threshold, and the first read-write conversion subcircuit 51 can transmit the first data transmitted to the second data line 40 to the third data line 60 when the comparison result is indicative of not exceeding the preset threshold. Meanwhile, the check code data Check_data2 on the second data line 40 are transmitted to the third data line 60 by means of the second read-write conversion subcircuit 52, such that an error detection and/or an error correction are performed on data on the third data line 60 according to the check code data Check_data2, to improve accuracy of writing data to the storage array region. The check code data Check_data1 and the check code data Check_data2 may be the same, or may satisfy a preset algorithm. The transmission path between the buffer circuit 20 and the first read-write conversion subcircuit 51 has a length L1, and the transmission path between the buffer circuit 20 and the second read-write conversion subcircuit 52 has a length L2, wherein L1≥L2. Based on such setting, it is convenient to perform error detection and/or error correction on the read data at a location close to a data pad, such that the accuracy of reading the data from the storage apparatus may be improved. The transmitted data generally include a data string comprising 0 and 1, by applying this power-saving algorithm into a transmission process of written data, number of inversions of the data written into the storage apparatus in the transmission process can be reduced without changing the transmission path of the written data, such that the power consumption in the transmission process of the written data can be effectively reduced. In this embodiment, the power consumption in the data transmission process of the data written into the storage array region is reduced while ensuring that the density and the number of memory cells in the memory cell array are not reduced, such that the accuracy of writing the data into the storage array region is improved, which can further improve energy-saving performance and storage performance of the semiconductor storage apparatus.

As an example, with continued reference to FIG. 1. in one embodiment of the present disclosure, the encoding circuit 31 may comprise an error correction code (ECC) encoding subcircuit. ECC check code data are generated by means of the ECC encoding subcircuit according to the first data on the first data line 30, such that subsequently an error detection and/or an error correction are performed on the data in the storage array region according to the ECC check code data, to improve the accuracy of the stored data.

It is to be noted that the second data on the second data line described in the present disclosure do not include the check code data on the second data line.

Figure 2:
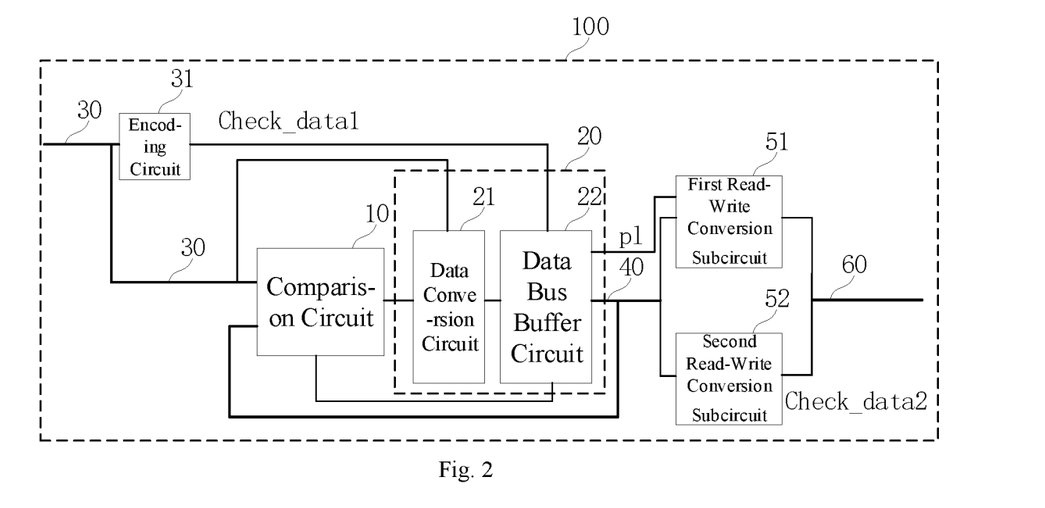
FIG. 2 is a schematic diagram showing a circuit principle of a data transmission circuit according to a second embodiment of the present disclosure.

Further, referring to FIG. 2, in one embodiment of the present disclosure, the buffer circuit 20 includes a data conversion circuit 21 and a data bus buffer circuit 22. The data conversion circuit 21 is electrically connected to the first data line 30, the comparison circuit 10, and the data bus buffer circuit 22. The data conversion circuit 21 is configured to transmit the opposite data of the first data on the first data line 30 to the data bus buffer circuit 22 when the comparison result is indicative of exceeding the preset threshold, and transmit the first data on the first data line 30 to the data bus buffer circuit 22 when the comparison result is indicative of not exceeding the preset threshold. The data bus buffer circuit 22 is electrically connected to the encoding circuit 31, the data conversion circuit 21, the comparison circuit 10, and the second data line 40. The data bus buffer circuit 22 is configured to generate a data polarity identification signal pl according to the comparison result, and the data bus buffer circuit 22 is also configured to transmit the first data or the opposite data of the first data to the second data line 40. It is convenient to restore the inverted data according to the data polarity identification signal pl, to ensure accuracy of data transmission.

Figure 3:
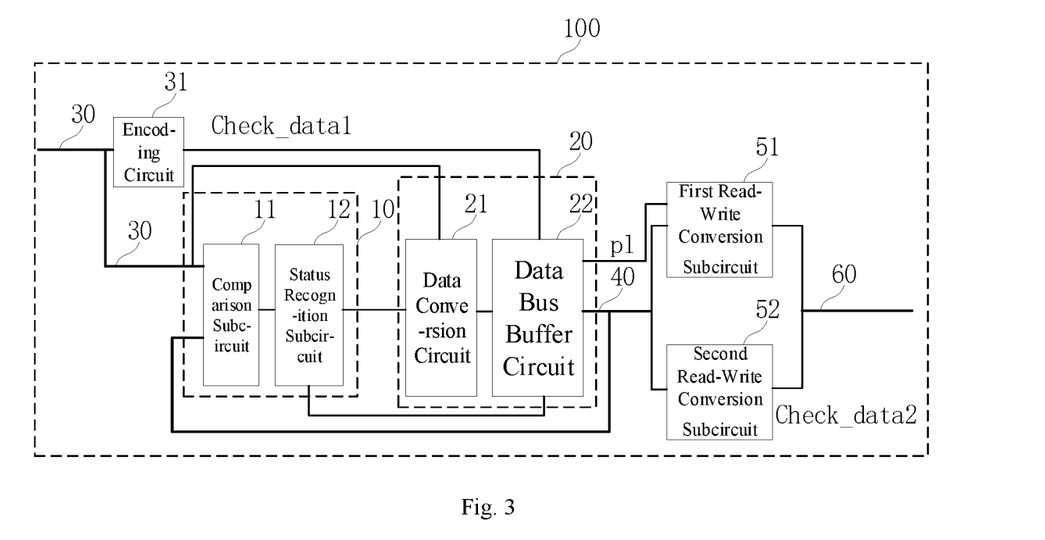
FIG. 3 is a schematic diagram showing a circuit principle of a data transmission circuit according to a third embodiment of the present disclosure.

Further, referring to FIG. 3, in one embodiment of the present disclosure, the preset threshold may be set half of the preset bit width, wherein the comparison circuit 10 comprises a comparison subcircuit 11 and a status recognition subcircuit 12. The comparison subcircuit 11 is configured to compare the first data on the first data line 30 and the second data on the second data line 40 bit by bit, and output comparison status data of each bit. The status recognition subcircuit 12 is electrically connected to the comparison subcircuit 11 and the data conversion circuit 21. The status recognition subcircuit 12 is configured to perform statistics on the comparison status data of each bit, and generate the comparison result according to a statistical result. The data conversion circuit 21 transmits the opposite data of the first data on the first data line 30 to the data bus buffer circuit 22 when the comparison result is indicative of exceeding the preset threshold, and transmits the first data on the first data line 30 to the data bus buffer circuit 22 when the comparison result is indicative of not exceeding the preset threshold. In this way, number of data inversions is reduced under the premise of ensuring the accuracy of data transmission, to effectively reduce power consumption during data transmission.

Figure 4A:
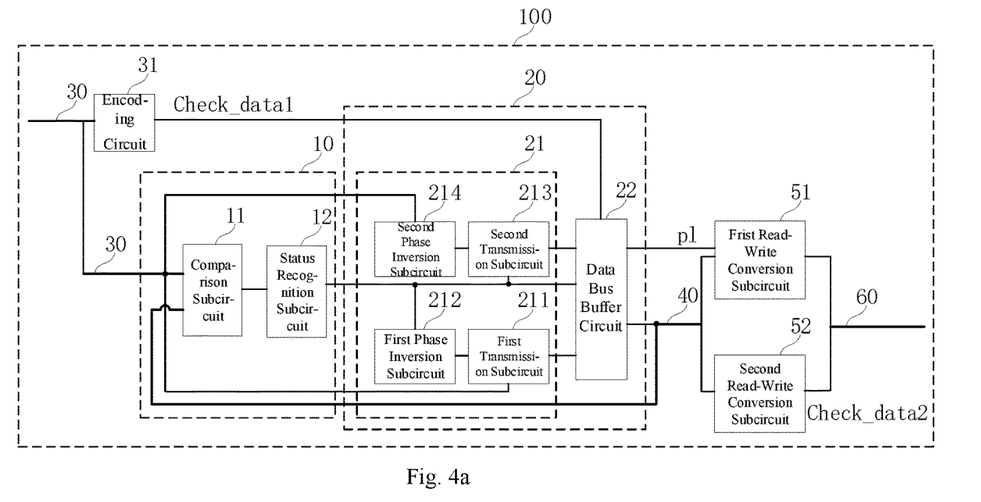
FIG. 4a is a schematic diagram showing a circuit principle of a data transmission circuit according to a fourth embodiment of the present disclosure.
Figure 4B:
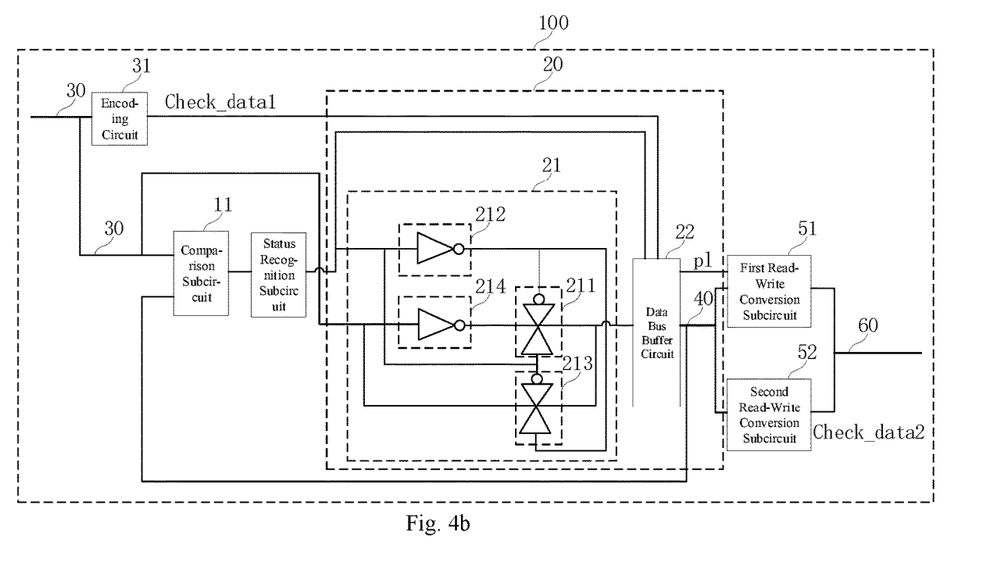

Further, referring to FIG. 4a and FIG. 4b, in one embodiment of the present disclosure, the data conversion circuit 21 includes a first transmission subcircuit 211, a first phase inversion subcircuit 212, a second transmission subcircuit 213, and a second phase inversion subcircuit 214. The first transmission subcircuit 211 is electrically connected to the first data line 30 and the data bus buffer circuit 22, and is electrically connected to an output terminal of the status recognition subcircuit 12 by means of the first phase inversion subcircuit 212. The first transmission subcircuit 211 is configured to transmit the first data on the first data line 30 to the data bus buffer circuit 22 when the comparison result is indicative of not exceeding the preset threshold. The second transmission subcircuit 213 is electrically connected to the data bus buffer circuit 22 and the output terminal of the status recognition subcircuit 12, and is electrically connected to the first data line 30 by means of the second phase inversion subcircuit 214. The second transmission subcircuit 213 is configured to transmit the opposite data of the first data to the data bus buffer circuit 22 when the comparison result is indicative of exceeding the preset threshold. In this embodiment, the number of data inversions can be reduced under the premise of ensuring the accuracy of data transmission, such that the power consumption in the transmission process of written data can be effectively reduced.

Figure 5:
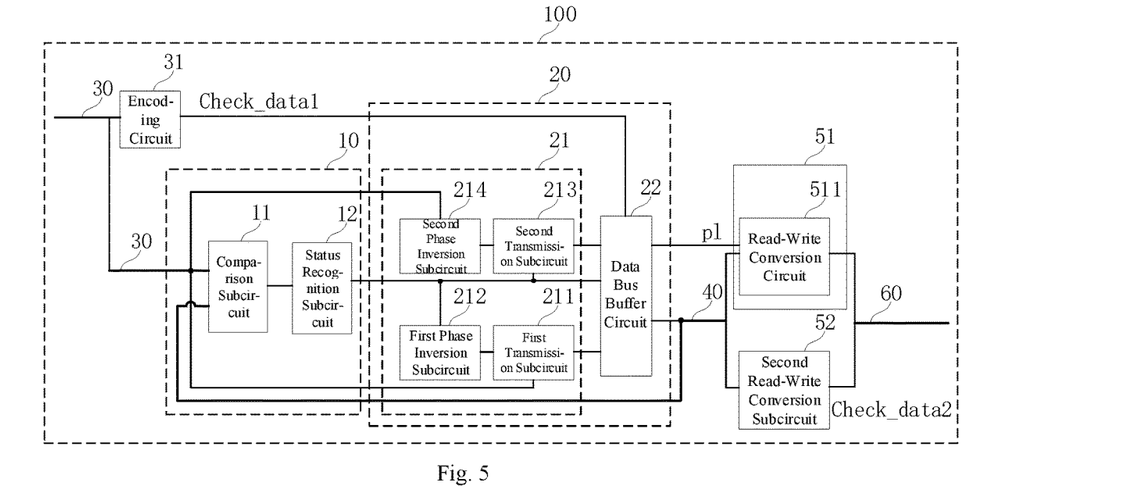
FIG. 5 is a schematic diagram showing a circuit principle of a data transmission circuit according to a fifth embodiment of the present disclosure.

Further, referring to FIG. 5, in one embodiment of the present disclosure, the first read-write conversion subcircuit 51 includes a read-write conversion circuit 511, wherein the read-write conversion circuit 511 is electrically connected to the second data line 40 and the third data line 60. The read-write conversion circuit 511 is configured to invert the opposite data of the first data transmitted to the second data line 40 and then transmit the inverted opposite data to the third data line 60 when the comparison result is indicative of exceeding the preset threshold, and transmit the first data transmitted to the second data line 40 to the third data line 60 when the comparison result is indicative of not exceeding the preset threshold.

Figure 6:
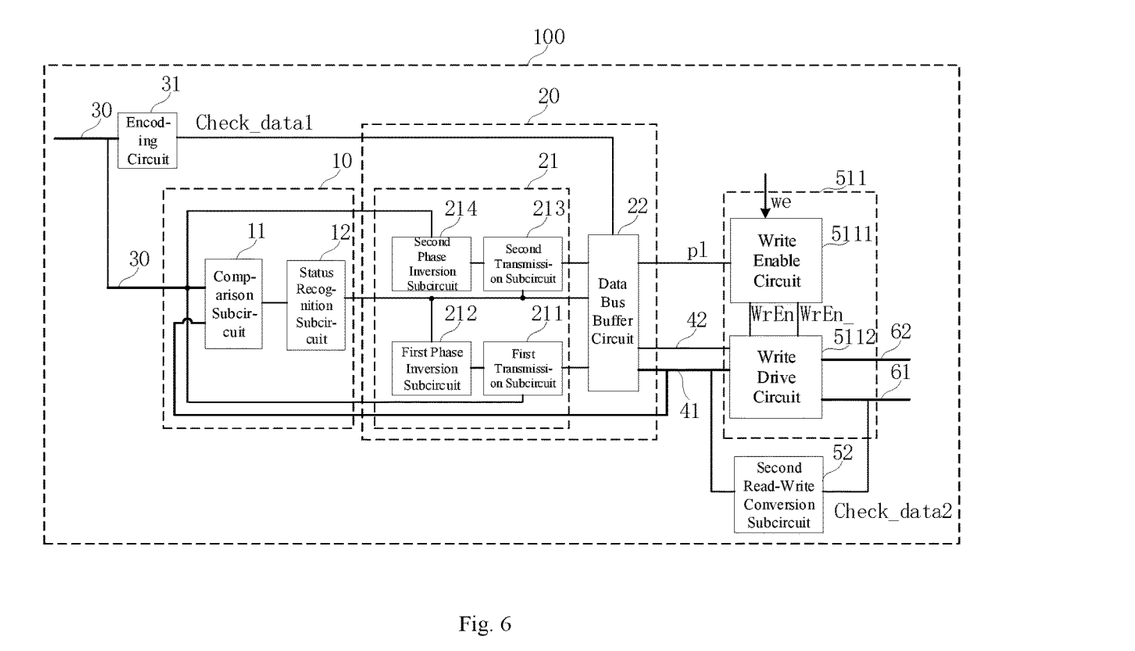
FIG. 6 is a schematic diagram showing a circuit principle of a data transmission circuit according to a sixth embodiment of the present disclosure.

Further, referring to FIG. 6, in one embodiment of the present disclosure, the second data line 40 includes a global data line 41 and a complementary global data line 42. The global data line 41 and the complementary global data line 42 are configured to transmit signals mutually inverted in phase. The third data line 60 includes a local data line 61 and a complementary local data line 62, wherein the local data line 61 and the complementary local data line 62 are configured to transmit signals mutually inverted in phase. The inverting the opposite data of the first data transmitted to the second data line 40 and then transmitting the inverted opposite data to the third data line 60 comprise: inverting the opposite data of the first data transmitted to the global data line 41 and then transmitting the inverted opposite data to the local data line 61. The transmitting the first data transmitted to the second data line 40 to the third data line 60 comprises: transmitting the first data transmitted to the global data line 41 to the local data line 61.

As an example, with continued reference to FIG. 6. in one embodiment of the present disclosure, the read-write conversion circuit 511 includes a write enable circuit 5111 and a write drive circuit 5112. The write enable circuit 5111 is configured to generate a write enable signal WrEn and a write enable inverted signal WrEn_ according to the data polarity identification signal pl and an initial write enable signal we. The write drive circuit 5112 is configured to generate third data according to the write enable signal WrEn, the write enable inverse signal WrEn_, and the first data or the opposite data of the first data transmitted to the second data line 40, and transmit the third data to the third data line.

Figure 7:
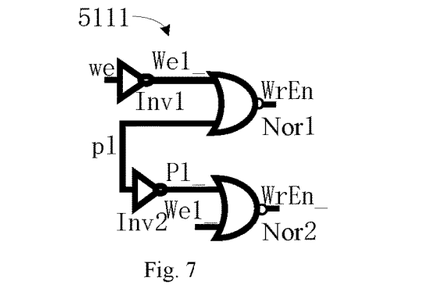
FIG. 7 is a schematic circuit diagram of a write enable circuit in a data transmission circuit according to an embodiment of the present disclosure.

As an example, with reference to FIG. 7, in one embodiment of the present disclosure, the write enable circuit 71 comprises a first inverter Inv1, a first NOR gate Nor1, a second inverter Inv2, and a second NOR gate Nor2. An input terminal of the first inverter Inv1 is electrically connected to the initial write enable signal we, and an output terminal of the first inverter Inv1 is configured to output a first write enable inverted signal We1_. An input terminal of the first NOR gate Nor is electrically connected to the data polarity identification signal pl and the output terminal of the first inverter Inv1, and an output terminal of the first NOR gate Nor is configured to output the write enable signal WrEn. An input terminal of the second inverter Inv2 is electrically connected to the data polarity identification signal pl, and an output terminal of the second inverter Inv2 is configured to output a data polarity identification inverted signal Pl_. An input terminal of the second NOR gate Nor2 is electrically connected to the output terminal of the second inverter Inv2 and the output terminal of the first inverter Inv1, and an output terminal of the second NOR gate Nor2 is configured to output the write enable inverted signal WrEn_.

Figure 8:
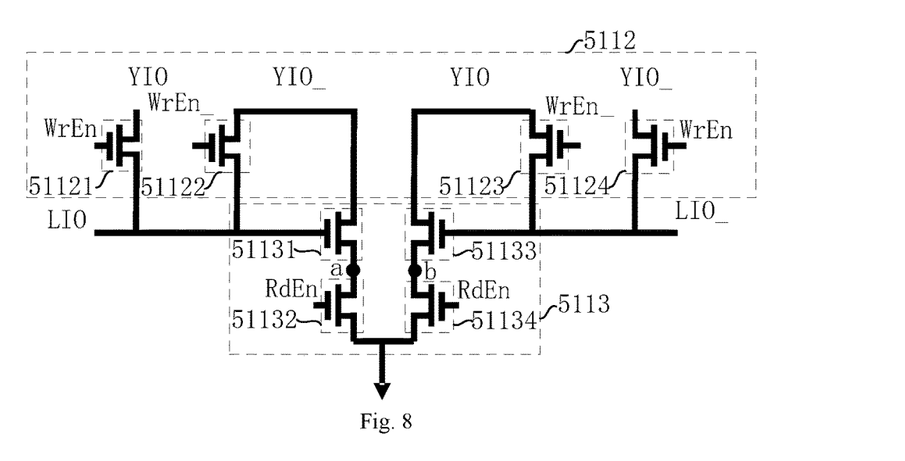
FIG. 8 is a schematic circuit diagram of a write drive circuit in a data transmission circuit according to an embodiment of the present disclosure.

As an example, with reference to FIG. 8, in one embodiment of the present disclosure, the write drive circuit 5112 comprises a first switch subcircuit 51121, a second switch subcircuit 51122, a third switch subcircuit 51123, and a fourth switch subcircuit 51124. The first switch subcircuit 51121 is configured to electrically connect the local data line LIO and the global data line YIO according to the write enable signal WrEn. The second switch subcircuit 51122 is configured to electrically connect the local data line LIO and the complementary global data line YIO_ according to the write enable inverted signal WrEn_. The third switch subcircuit 51123 is configured to electrically connect the complementary local data line LIO_ and the global data line YIO according to the write enable inverted signal WrEn_. The fourth switch subcircuit 51124 is configured to electrically connect the complementary local data line LIO_ and the complementary global data line YIO_ according to the write enable signal WrEn.

As an example, with continued reference to FIG. 8, in one embodiment of the present disclosure, the read-write conversion circuit 511 further comprises a read drive circuit 5113, wherein the read drive circuit 5113 comprises a fifth switch subcircuit 51131, a sixth switch subcircuit 51132, a seventh switch subcircuit 51133, and an eighth switch subcircuit 51134. A control terminal of the fifth switch subcircuit 51131 is electrically connected to the local data line LIO, and is configured to electrically connect the complementary global data line YIO_ and a first node a according to a control terminal signal. The sixth switch subcircuit 51132 is configured to electrically connect the first node a and a ground terminal according to the read enable signal. A control terminal of the seventh switch subcircuit 51133 is electrically connected to the complementary local data line LIO_, and is configured to electrically connect the global data line YIO and a second node b according to the control terminal signal. The eighth switch subcircuit 51134 is configured to electrically connect the second node b and the ground terminal according to the read enable signal.

Figure 9:
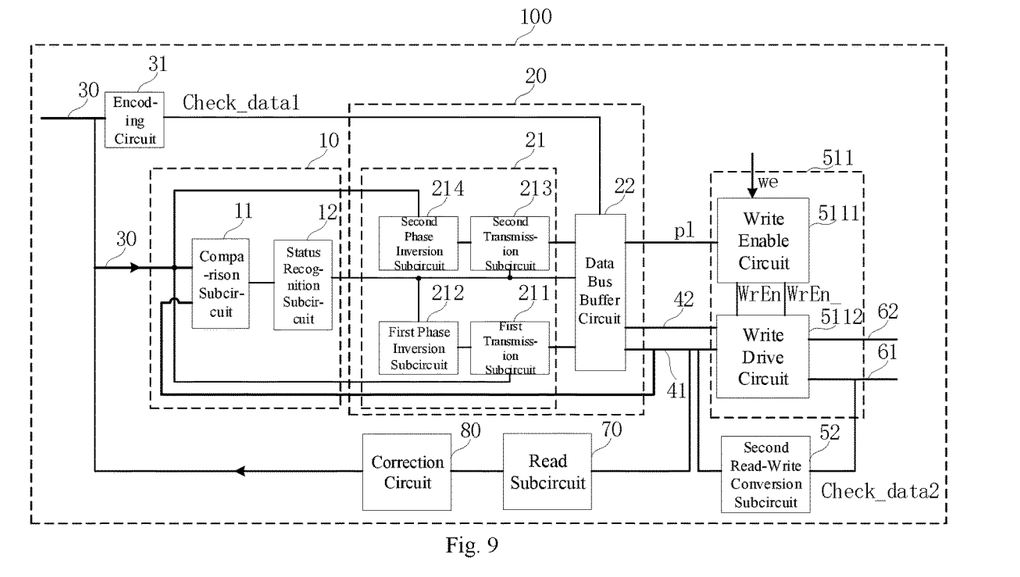
FIG. 9 is a schematic diagram showing a circuit principle of a data transmission circuit according to a seventh embodiment of the present disclosure.

Further, referring to FIG. 9, in one embodiment of the present disclosure, the data transmission circuit 100 also includes a read subcircuit 70 and a correction circuit 80. The read subcircuit 70 is electrically connected to the second data line 40, and is configured to read the second data and the check code data Check_data2 on the second data line 40. The correction circuit 80 is electrically connected to the first data line 30 and the read subcircuit 70. The correction circuit 80 is configured to receive the second data and the check code data Check_data2 on the second data line 40, and perform error detection and/or error correction on the second data according to the check code data Check_data2 to generate corrected data and transmit the corrected data to the first data line 30. This embodiment can effectively improve accuracy of reading data from the storage apparatus.

Further, in one embodiment of the present disclosure, there is provided a storage apparatus, which comprises the data transmission circuit according to any one of the above embodiments of the present disclosure, wherein the storage apparatus is configured to store and transmit data of a read operation or write operation. By applying this power-saving algorithm into a transmission process of written data, number of inversions of the data written into the storage apparatus in the transmission process can be reduced without changing the transmission path of the written data, such that the power consumption in the transmission process of the written data can be effectively reduced. In the meanwhile, the check code data generated by the encoding circuit according to the first data on the first data line are transmitted in parallel to a next-stage data line, such that decrease of the efficiency of data transmission due to introduction of the encoding circuit can be avoided while ensuring the accuracy of writing the data. In this embodiment, the power consumption in the data transmission process of the data written into the storage array region is reduced while ensuring that the density and the number of memory cells in the memory cell array are not reduced, such that the accuracy of writing the data into the storage array region is improved, which can further improve the energy-saving performance and the storage performance of the semiconductor storage apparatus.

Figure 10:
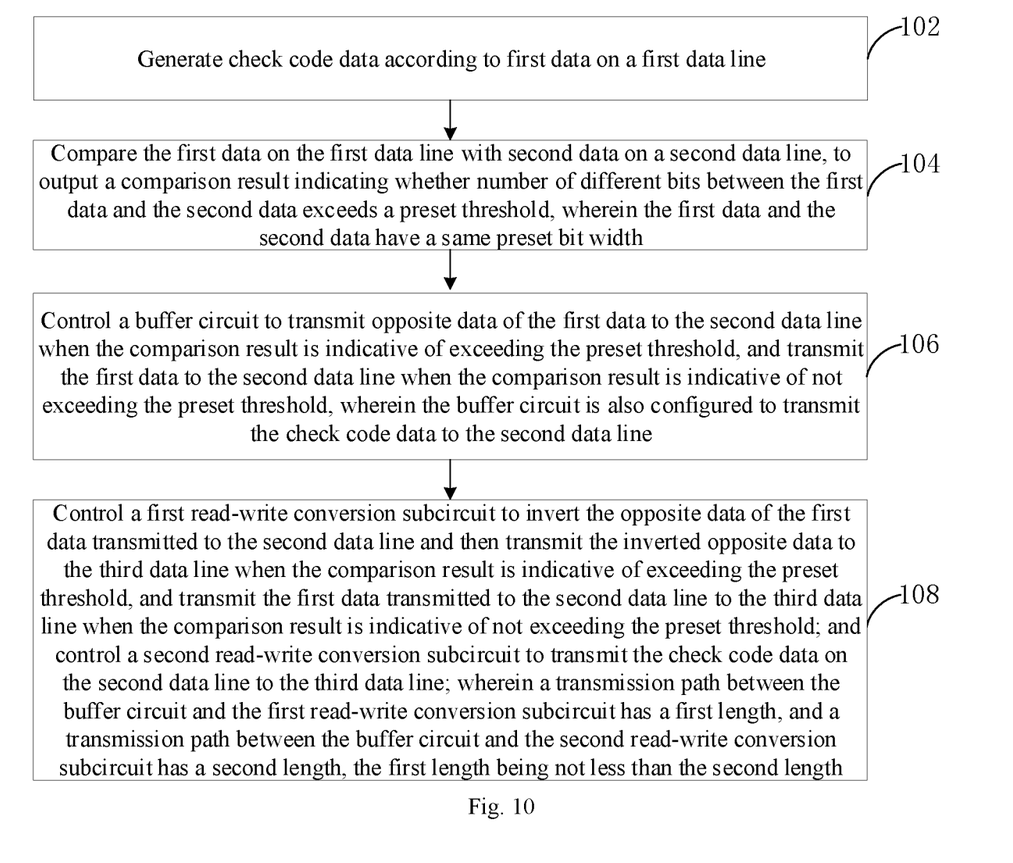
FIG. 10 is a schematic flow diagram of a data transmission method according to an embodiment of the present disclosure.

Further, with reference to FIG. 10, in one embodiment of the present disclosure, there is provided a data transmission method, which includes:

Step 102: generating check code data according to first data on a first data line;

Step 104: comparing the first data on the first data line with second data on a second data line, to output a comparison result indicating whether number of different bits between the first data and the second data exceeds a preset threshold, wherein the first data and the second data have a same preset bit width;

Step 106: controlling a buffer circuit to transmit opposite data of the first data to the second data line when the comparison result is indicative of exceeding the preset threshold, and transmitting the first data to the second data line when the comparison result is indicative of not exceeding the preset threshold, wherein the buffer circuit is also configured to transmit the check code data to the second data line; and Step 108: controlling a first read-write conversion subcircuit to invert the opposite data of the first data transmitted to the second data line and then transmit the inverted opposite data to the third data line when the comparison result is indicative of exceeding the preset threshold, and transmit the first data transmitted to the second data line to the third data line when the comparison result is indicative of not exceeding the preset threshold; and controlling a second read-write conversion subcircuit to transmit the check code data on the second data line to the third data line. A transmission path between the buffer circuit and the first read-write conversion subcircuit has a first length, and a transmission path between the buffer circuit and the second read-write conversion subcircuit has a second length, wherein the first length is not less than the second length.

In some embodiments, with continued reference to FIG. 10, by applying this power-saving algorithm into a transmission process of written data during the period of generating the check code data according to the first data on the first data line, number of inversions of the data written into the storage apparatus in the transmission process can be reduced without changing the transmission path of the written data, such that the power consumption in the transmission process of the written data can be effectively reduced. In the meanwhile, the check code data are transmitted in parallel to a next-stage data line, such that decrease of the efficiency of data transmission due to data check can be avoided while ensuring the accuracy of writing the data. The length of the transmission path between the buffer circuit and the first read-write conversion subcircuit is set to be not less than the length of the transmission path between the buffer circuit and the second read-write conversion subcircuit, such that a length of a path for writing the check code data is reduced, and time required for writing the check code data is shortened. In this way, time spent in generating the check code data is compensated for, such that the data and the check code are synchronously written as much as possible, and thus writing speed is improved. In this embodiment, the power consumption in the data transmission process of the data written into the storage array region is reduced while ensuring that the density and the number of memory cells in the memory cell array are not reduced, such that the accuracy of writing the data into the storage array region is improved, which can further improve the energy-saving performance and the storage performance of the semiconductor storage apparatus.

Figure 11:
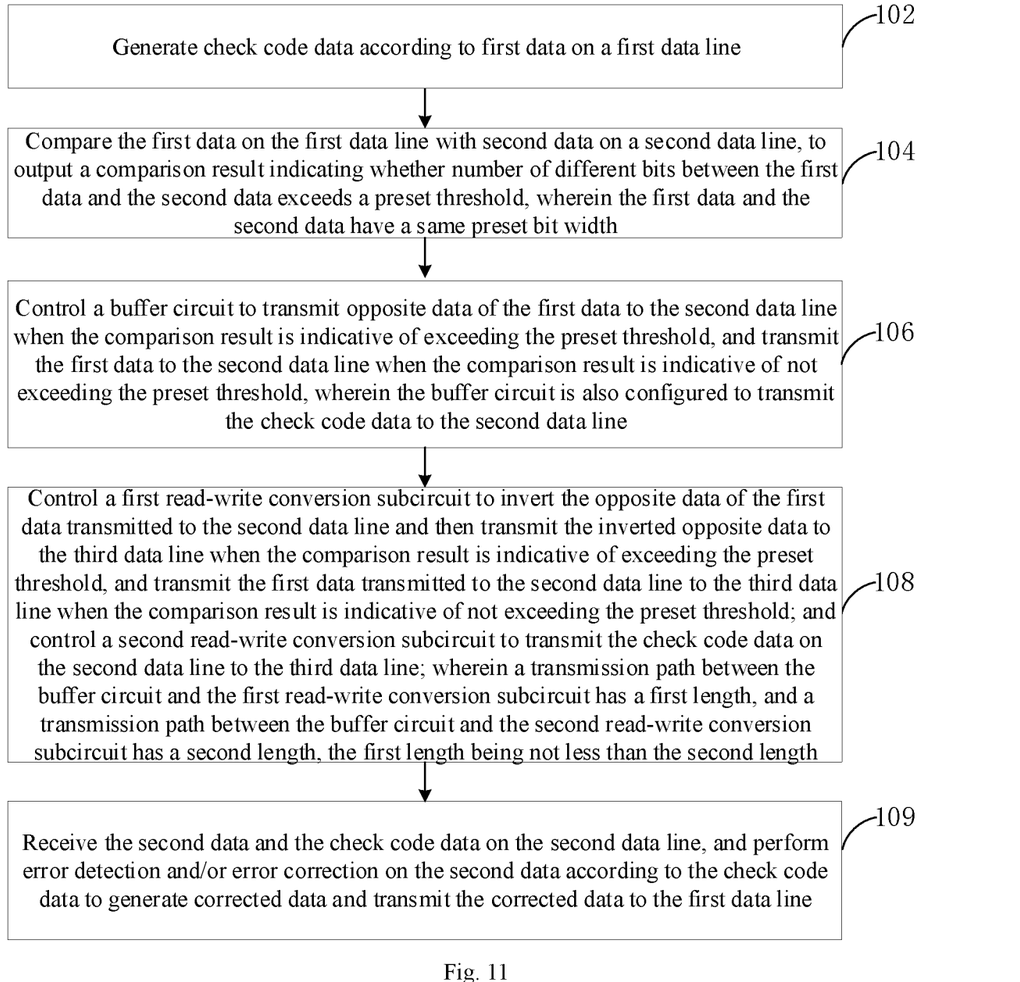
FIG. 11 is a schematic flow diagram of a data transmission method according to another embodiment of the present disclosure.

Further, referring to FIG. 11, in one embodiment of the present disclosure, the preset threshold may be set to half of the preset bit width, and the method also includes:

Step 109: receiving the second data and the check code data on the second data line, and performing error detection and/or error correction on the second data according to the check code data to generate corrected data and transmit the corrected data to the first data line.

In some embodiments, with continued reference to FIG. 11, the written data are prone to occurrence of exceptions due to various factors during the transmission process, which may lead to differences between the written data written and stored in the storage apparatus and the initially written data. In the process of reading data from the storage apparatus, corrected data are generated by performing error detection and/or error correction on the second data on the second data line (such as global data on the global data line) according to the check code data, and the corrected data are transmitted to the first data line such as a data bus, such that the corrected data are outputted by means of a data pad of the storage apparatus. In this way, the accuracy of reading the data from the storage apparatus can be effectively improved.

In one embodiment of the present disclosure, there is provided a computer-readable storage medium, storing a computer program thereon. The computer program is executable by a processor, whereby the data transmission method according to any one of the above embodiments of the present disclosure is implemented.

It should be understood that although the various steps in the flowcharts of FIG. 10 and FIG. 11 are displayed in sequence as indicated by the arrows, these steps are not necessarily performed in sequence in the order indicated by the arrows. It should be understood that unless expressly stated herein, the execution of these steps is not strictly limited in sequence, and these steps may be performed in other orders. Moreover, at least a part of the steps in FIG. 10 and FIG. 11 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

Those of ordinary skill in the art may understand that implementation of all or some flows in the method according to the foregoing embodiments may be achieved by instructing relevant hardware by a computer program, wherein the computer program may be stored in a non-transitory computer-readable storage medium, and when the computer program is executed, the flows of the embodiments of the foregoing methods may be included. Any reference to memory, storage, database or other media used in the embodiments provided in the present disclosure may include nonvolatile and/or volatile memory. The nonvolatile memory may include a read-only memory (ROM), a programmable ROM (PROM), an electrically programmable read-only memory ROM (EPROM), an electrically erasable programmable ROM (EEPROM) or a flash memory. The volatile memory may include a random access memory (RAM) or an external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronization link (Synchlink) DRAM (SLDRAM), Rambus dynamic RAM (RDRAM), direct Rambus dynamic RAM (DRDRAM), and Rambus dynamic RAM (RDRAM), etc.

It is to be noted that the above embodiments are intended for purposes of illustration only and are not intended to limit the present disclosure.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A data transmission circuit, comprising:
an encoding circuit configured to generate check code data according to first data on a first data line;
a comparison circuit configured to receive the first data on the first data line and second data on a second data line, and compare the first data with the second data to output a comparison result indicating whether number of different bits between the first data and the second data exceeds a preset threshold, wherein the first data and the second data have a same preset bit width;
a buffer circuit electrically connected to the first data line, the comparison circuit, the encoding circuit, and the second data line, wherein the buffer circuit is configured to transmit opposite data of the first data to the second data line when the comparison result is indicative of exceeding the preset threshold, and transmit the first data to the second data line when the comparison result is indicative of not exceeding the preset threshold; the buffer circuit being further configured to transmit the check code data to the second data line;
a first read-write conversion subcircuit electrically connected to both the second data line and a third data line, wherein the first read-write conversion subcircuit is configured to invert the opposite data of the first data transmitted to the second data line and then transmit inverted opposite data to the third data line when the comparison result is indicative of exceeding the preset threshold, and transmit the first data transmitted to the second data line to the third data line when the comparison result is indicative of not exceeding the preset threshold; and
a second read-write conversion subcircuit electrically connected to both the second data line and the third data line, wherein the second read-write conversion subcircuit is configured to transmit the check code data on the second data line to the third data line;
wherein a transmission path between the buffer circuit and the first read-write conversion subcircuit has a first length, a transmission path between the buffer circuit and the second read-write conversion subcircuit having a second length, the first length being not less than the second length.

2. The data transmission circuit according to claim 1, wherein the buffer circuit comprises a data conversion circuit and a data bus buffer circuit;
wherein the data conversion circuit is electrically connected to the first data line, the comparison circuit and the data bus buffer circuit, the data conversion circuit being configured to transmit the opposite data of the first data to the data bus buffer circuit when the comparison result is indicative of exceeding the preset threshold, and transmit the first data to the data bus buffer circuit when the comparison result is indicative of not exceeding the preset threshold; and
wherein the data bus buffer circuit is electrically connected to the encoding circuit, the data conversion circuit, the comparison circuit and the second data line, the data bus buffer circuit being configured to generate a data polarity identification signal according to the comparison result, and the data bus buffer circuit being further configured to transmit the first data or the opposite data of the first data to the second data line.

3. The data transmission circuit according to claim 2, wherein the preset threshold is half of the preset bit width, the comparison circuit comprising:
a comparison subcircuit configured to compare the first data on the first data line and the second data on the second data line bit by bit, and output comparison status data of each bit; and
a status recognition subcircuit electrically connected to the comparison subcircuit and the data conversion circuit, the status recognition subcircuit being configured to perform statistics on the comparison status data of each bit, and generate the comparison result according to a statistical result.

4. The data transmission circuit according to claim 3, wherein the data conversion circuit comprises:
a first transmission subcircuit electrically connected to the first data line and the data bus buffer circuit and electrically connected to an output terminal of the status recognition subcircuit by means of a first phase inversion subcircuit, the first transmission subcircuit being configured to transmit the first data on the first data line to the data bus buffer circuit when the comparison result is indicative of not exceeding the preset threshold; and
a second transmission subcircuit electrically connected to the data bus buffer circuit and the output terminal of the status recognition subcircuit and electrically connected to the first data line by means of a second phase inversion subcircuit, the second transmission subcircuit being configured to transmit the opposite data of the first data to the data bus buffer circuit when the comparison result is indicative of exceeding the preset threshold.

5. The data transmission circuit according to claim 2, wherein the first read-write conversion subcircuit comprises:
a read-write conversion circuit electrically connected to both the second data line and the third data line, wherein the read-write conversion circuit is configured to invert the opposite data of the first data transmitted to the second data line and then transmit the inverted opposite data to the third data line when the comparison result is indicative of exceeding the preset threshold, and transmit the first data transmitted to the second data line to the third data line when the comparison result is indicative of not exceeding the preset threshold.

6. The data transmission circuit according to claim 5, wherein the second data line comprises a global data line and a complementary global data line, the global data line and the complementary global data line being configured to transmit signals mutually inverted in phase, the third data line comprising a local data line and a complementary local data line, the local data line and the complementary local data line being configured to transmit signals mutually inverted in phase;
the inverting the opposite data of the first data transmitted to the second data line and then transmitting the inverted opposite data to the third data line comprise:
inverting the opposite data of the first data transmitted to the global data line and then transmitting the inverted opposite data to the local data line;
the transmitting the first data transmitted to the second data line to the third data line comprises:
transmitting the first data transmitted to the global data line to the local data line.

7. The data transmission circuit according to claim 6, wherein the read-write conversion circuit comprises:
a write enable circuit configured to generate a write enable signal and a write enable inverted signal according to the data polarity identification signal and an initial write enable signal; and
a write drive circuit configured to generate third data according to the write enable signal, the write enable inverse signal, and the first data or the opposite data of the first data transmitted to the second data line, and transmit the third data to the third data line.

8. The data transmission circuit according to claim 7, wherein the write enable circuit comprises:
a first inverter, an input terminal of the first inverter being electrically connected to the initial write enable signal, and an output terminal of the first inverter being configured to output a first write enable inverted signal;
a first NOR gate, an input terminal of the first NOR gate being electrically connected to the data polarity identification signal and the output terminal of the first inverter, and an output terminal of the first NOR gate being configured to output a write enable signal;
a second inverter, an input terminal of the second inverter being electrically connected to the data polarity identification signal, and an output terminal of the second inverter being configured to output a data polarity identification inverted signal; and
a second NOR gate, an input terminal of the second NOR gate being electrically connected to the output terminal of the second inverter and the output terminal of the first inverter, and an output terminal of the second NOR gate being configured to output the write enable inverted signal.

9. The data transmission circuit according to claim 8, wherein the write drive circuit comprises:
a first switch subcircuit, configured to electrically connect the local data line and the global data line according to the write enable signal;
a second switch subcircuit, configured to electrically connect the local data line and the complementary global data line according to the write enable inverted signal;
a third switch subcircuit, configured to electrically connect the complementary local data line and the global data line according to the write enable inverted signal; and
a fourth switch subcircuit, configured to electrically connect the complementary local data line and the complementary global data line according to the write enable signal.

10. The data transmission circuit according to claim 9, wherein the read-write conversion circuit further comprises a read drive circuit, the read drive circuit comprising:
a fifth switch subcircuit, a control terminal of the fifth switch subcircuit being electrically connected to the local data line, the fifth switch subcircuit being configured to electrically connect the complementary global data line and a first node according to a control terminal signal;
a sixth switch subcircuit, configured to electrically connect the first node and a ground terminal according to a read enable signal;
a seventh switch subcircuit, a control terminal of the seventh switch subcircuit being electrically connected to the complementary local data line, the seventh switch subcircuit being configured to electrically connect the global data line and a second node according to the control terminal signal; and
an eighth switch subcircuit, configured to electrically connect the second node and the ground terminal according to the read enable signal.

11. The data transmission circuit according to claim 1, further comprising:
a read subcircuit electrically connected to the second data line, the read subcircuit being configured to read the second data and the check code data on the second data line; and
a correction circuit electrically connected to the first data line and the read subcircuit, wherein the correction circuit is configured to receive the second data and the check code data on the second data line, and perform error detection and/or error correction on the second data according to the check code data to generate corrected data and transmit the corrected data to the first data line.

12. The data transmission circuit according to claim 1, wherein the encoding circuit comprises an error correction code (ECC) encoding subcircuit.

13. A storage apparatus comprising a data transmission circuit, wherein the storage apparatus is configured to store and transmit data of a read operation or write operation;
wherein the data transmission circuit comprises:
an encoding circuit configured to generate check code data according to first data on a first data line;
a comparison circuit configured to receive the first data on the first data line and second data on a second data line, and compare the first data with the second data to output a comparison result indicating whether number of different bits between the first data and the second data exceeds a preset threshold, wherein the first data and the second data have a same preset bit width;
a buffer circuit electrically connected to the first data line, the comparison circuit, the encoding circuit, and the second data line, wherein the buffer circuit is configured to transmit opposite data of the first data to the second data line when the comparison result is indicative of exceeding the preset threshold, and transmit the first data to the second data line when the comparison result is indicative of not exceeding the preset threshold; the buffer circuit being further configured to transmit the check code data to the second data line;

a first read-write conversion subcircuit electrically connected to both the second data line and a third data line, wherein the first read-write conversion subcircuit is configured to invert the opposite data of the first data transmitted to the second data line and then transmit inverted opposite data to the third data line when the comparison result is indicative of exceeding the preset threshold, and transmit the first data transmitted to the second data line to the third data line when the comparison result is indicative of not exceeding the preset threshold; and a second read-write conversion subcircuit electrically connected to both the second data line and the third data line, wherein the second read-write conversion subcircuit is configured to transmit the check code data on the second data line to the third data line;

wherein a transmission path between the buffer circuit and the first read-write conversion subcircuit has a first length, a transmission path between the buffer circuit and the second read-write conversion subcircuit having a second length, the first length being not less than the second length.

14. A data transmission method, comprising:

generating check code data according to first data on a first data line;

comparing the first data on the first data line with second data on a second data line, to output a comparison result indicating whether number of different bits between the first data and the second data exceeds a preset threshold, wherein the first data and the second data have a same preset bit width;

controlling a buffer circuit to transmit opposite data of the first data to the second data line when the comparison result is indicative of exceeding the preset threshold, and transmit the first data to the second data line when the comparison result is indicative of not exceeding the preset threshold; wherein the buffer circuit is further configured to transmit the check code data to the second data line; and controlling a first read-write conversion subcircuit to invert the opposite data of the first data transmitted to the second data line and then transmit inverted opposite data to a third data line when the comparison result is indicative of exceeding the preset threshold, and transmit the first data transmitted to the second data line to the third data line when the comparison result is indicative of not exceeding the preset threshold; and controlling a second read-write conversion subcircuit to transmit the check code data on the second data line to the third data line; wherein a transmission path between the buffer circuit and the first read-write conversion subcircuit has a first length, a transmission path between the buffer circuit and the second read-write conversion subcircuit having a second length, and the first length being not less than the second length.

15. The data transmission method according to claim 14, wherein the preset threshold is half of the preset bit width, the method further comprising:

receiving the second data and the check code data on the second data line, and performing error detection and/or error correction on the second data according to the check code data to generate corrected data and transmit the corrected data to the first data line.

* * * * *